(12) United States Patent
Ji

(10) Patent No.: US 10,627,844 B1
(45) Date of Patent: Apr. 21, 2020

(54) LDO REGULATOR WITH CIRCUITS FOR NOISE REDUCTION

(71) Applicant: Dialog Semiconductor (UK) Limited, London (GB)

(72) Inventor: Cang Ji, Kirchheim/Teck (DE)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 16/373,892

(22) Filed: Apr. 3, 2019

(30) Foreign Application Priority Data

Dec. 10, 2018 (DE) ......................... 10 2018 221 294

(51) Int. Cl.
*G05F 1/575* (2006.01)
*G05F 1/46* (2006.01)
*H03F 3/45* (2006.01)
*G05F 1/56* (2006.01)

(52) U.S. Cl.
CPC .............. *G05F 1/575* (2013.01); *G05F 1/467* (2013.01); *G05F 1/561* (2013.01); *H03F 3/45* (2013.01)

(58) Field of Classification Search
CPC .......... G05F 1/467; G05F 1/561; G05F 1/575; H03F 3/45
USPC ......................................... 323/272, 280–286
See application file for complete search history.

(56) References Cited

U.S. PATENT DOCUMENTS

| | | | |
|---|---|---|---|
| 7,919,954 B1 * | 4/2011 | Mannama | G05F 1/575 323/272 |
| 8,624,568 B2 | 1/2014 | Ivanov et al. | |
| 9,450,490 B2 * | 9/2016 | Cavallini | H05B 45/37 |
| 10,044,269 B2 * | 8/2018 | Lin | G05F 3/262 |
| 10,128,757 B2 * | 11/2018 | Unno | H02M 3/1582 |
| 10,186,967 B2 * | 1/2019 | Huang | H02M 3/158 |
| 10,396,807 B1 * | 8/2019 | Dai | H03K 3/0322 |
| 2003/0111986 A1 * | 6/2003 | Xi | G05F 1/575 323/280 |
| 2009/0128230 A1 | 5/2009 | Roh et al. | |
| 2009/0231030 A1 * | 9/2009 | Li | H03F 3/2173 330/10 |

(Continued)

OTHER PUBLICATIONS

German Office Action, File No. 10 2018 221 294.5, Applicant: Dialog Semiconductor (UK) Limited, dated Jul. 10, 2019, 8 pages, and English language translation, 10 pages.

(Continued)

*Primary Examiner* — Yemane Mehari
(74) *Attorney, Agent, or Firm* — Saile Ackerman LLC; Stephen B. Ackerman

(57) ABSTRACT

Linear voltage regulators and a method for low-dropout LDO regulators are presented. Specifically, LDO regulators with circuits for noise reduction are discussed. A linear voltage regulator has a first noise reduction filter, an error amplifier circuit, and a pass device. The pass device may be coupled between an input and output terminal of the regulator. The error amplifier circuit generates a control signal for controlling the pass device based on a filtered reference signal and an output voltage at the output terminal of the regulator. The first noise reduction filter generates the filtered reference signal based on a reference voltage of a reference voltage source by reducing noise originating from the reference voltage source or noise generated by one or more passive components coupled between the reference voltage source and the first noise reduction filter.

26 Claims, 9 Drawing Sheets

(56) References Cited

U.S. PATENT DOCUMENTS

| | | |
|---|---|---|
| 2010/0188141 A1 | 7/2010 | Aruga et al. |
| 2014/0176098 A1* | 6/2014 | Fang .................. G05F 1/46 323/280 |
| 2016/0334816 A1 | 11/2016 | Ji |
| 2018/0239380 A1* | 8/2018 | Ciomaga ............ G05F 1/575 |

OTHER PUBLICATIONS

"A CMOS Low Noise, Chopper Stabilized Low-Dropout Regulator With Current-Mode Feedback Error Amplifier," by Wonseok Oh et al., IEEE Transactions on Circuits and Systems—I: Regular Papers, vol. 55, No. 10, Nov. 2008, pp. 3006-3015.

"A Low-Noise Output Capacitorless Low-Dropout Regulator With a Switched-RC Bandgap Reference," by Raveesh Magod et al., IEEE Transactions on Power Electronics, vol. 32, No. 4, Apr. 2017, pp. 2856-2864.

* cited by examiner

LDO REGULATOR WITH CIRCUITS FOR NOISE REDUCTION

TECHNICAL FIELD

The present document relates to linear voltage regulators. In particular, the present document relates to low-dropout LDO regulators with circuits for noise reduction.

BACKGROUND

A low-dropout (LDO) regulator is a direct current (DC) linear voltage regulator capable of regulating its output voltage even when the supply voltage is very close to the output voltage. Compared to other types of DC to DC regulators, LDO regulators may exhibit a smaller overall size since no large inductors or transformers are required. Further, compared to switching regulators, there is no switching noise as no switching takes place in typical LDO regulators. Finally, as LDO regulators typically consist of a reference voltage source, an amplifier, and a pass element, the simplicity of the regulator design should be mentioned as an additional benefit of LDO regulators.

When LDO regulators are used to power noise sensitive analog circuits, noise reduction becomes important in the design process. Such noise sensitive analog circuits may include e.g. analog-to-digital converters, digital-to-analog converters, voltage-controlled oscillators, phase-locked loops, and high-speed clocks. For example, if an LDO regulator is used to provide a supply or reference voltage to a 12 bit, 16 bit or 18 bit analog-to-digital converter, the accuracy of the least significant bit LSB may severely depend on the accuracy of the supply or reference voltage provided by the LDO regulator.

SUMMARY

The present document addresses the technical problem of providing an LDO regulator with noise reduction circuits for substantially reducing noise of a wide frequency bandwidth without using external circuit components. Moreover, it is an object of the present document to provide circuits for noise reduction which do not affect the LDO's load and line transient response. According to an aspect, a linear voltage regulator may comprise a first noise reduction filter, an error amplifier circuit, and a pass device. The pass device may be coupled between an input terminal of the regulator and an output terminal of the regulator. The error amplifier circuit may be configured to generate a control signal for controlling the pass device based on a filtered reference signal and an output voltage at the output terminal of the regulator. The first noise reduction filter may be configured to generate the filtered reference signal based on a reference voltage of a reference voltage source by reducing noise originating from the reference voltage source or noise generated by one or more passive components coupled between the reference voltage source and the first noise reduction filter.

For example, the linear voltage regulator may be a low-dropout LDO regulator. The pass device may be a pass transistor such as e.g. a p-channel metal-oxide-semiconductor field effect transistor MOSFET. For instance, a source terminal of the pass transistor may be coupled to the input terminal of the regulator, a drain terminal of the pass transistor may be coupled to the output terminal of the regulator, and a gate terminal of the pass transistor may be coupled to an output of the error amplifier circuit for receiving said control signal generated by the error amplifier circuit.

The one or more passive components may be e.g. transistors. For example, the linear voltage regulator may comprise two transistors arranged as a series connection to form a high resistance voltage divider. The error amplifier circuit may be configured to determine the control signal by amplifying a difference between the filtered reference signal and the output voltage. In other words, the linear voltage regulator may comprise a feedback circuit for providing said output voltage at an input of the error amplifier circuit. In particular, said feedback circuit may directly connect the output terminal of the regulator to the input of the error amplifier circuit and no passive components may generate noise within this feedback circuit. This configuration may also be denoted as unity gain configuration. The described configuration makes it possible that the first noise reduction filter filters out all noise generated by the reference voltage source or noise generated by one or more passive components coupled between the reference voltage source and the first noise reduction filter. As a result, the output noise at the output terminal of the regulator is feedback as input noise of the error amplifier circuit, and said output noise is dominated by the noise of the error amplifier circuit and the noise of the pass device itself.

As a further advantage, the described linear voltage regulator has a built-in noise reduction mechanism and does not require external components for noise reduction in case the linear voltage regulator is used to generate a reference voltage for a noise sensitive electronic circuit. In particular, by filtering noise generated by the reference voltage source or noise generated by the one or more passive components with the help of the first noise reduction filter, large external capacitors or resistors for noise reduction become dispensable. In prior art, in contrast, external capacitors or resistors have been used e.g. at the output of a linear voltage regulator to remove noise in a post-processing step following the actual voltage regulation performed by the linear voltage regulator. Such a post-processing step is not required for the claimed linear voltage regulator.

Further, the first noise reduction filter may comprise a voltage controlled current source VCCS, a filter capacitor, and a filter switch configured to periodically disconnect an output of the VCCS from a first terminal of the filter capacitor.

The VCCS may also be denoted as transconductor or as transconductance amplifier. The VCCS may be configured to output a current proportional to its input voltage, i.e. a current proportional to a voltage difference between a voltage at a first input terminal of the VCCS and a voltage at a second input terminal of the VCCS. The filter switch may be implemented with any suitable device, such as, for example, a MOSFET, an insulated-gate bipolar transistor IGBT, a MOS-gated thyristor, or other suitable power devices. The filter switch may have a gate to which a respective switching signal may be applied to turn the filter switch on (i.e. to close the filter switch) or to turn the filter switch off (i.e. to open the filter switch).

Another terminal of the filter capacitor may be connected to a reference potential. Throughout this document, the term "reference potential" is meant in its broadest possible sense. In particular, the reference potential is not limited to ground i.e. a reference potential with a direct physical connection to earth. Rather, the term "reference potential" may refer to any reference point to which and from which electrical currents may flow or from which voltages may be measured. Moreover, it should be mentioned that the reference potentials mentioned in this document may not necessarily refer to the same physical contact. Instead, the reference potentials mentioned in this document may related to different physical contacts although reference is made to "the" reference potential for ease of presentation.

With the help of the VCCS and the filter switch, a low pass filter may be implemented. Further, by reducing a duty cycle of the switching signal applied to the filter switch, a cutoff frequency of this low pass filter may be reduced without increasing the capacitance of the filter capacitor. The other way around, when keeping the cutoff frequency of the low pass filter constant, the capacitance of the filter capacitor may be decreased, resulting in a smaller form factor of the first noise reduction filter. In this regard, the duty cycle of the switching signal may be defined as the ratio between the time the filter switch is closed and the time the filter switch is open.

The VCCS may be configured to receive, at the first input terminal of the VCCS, an unfiltered reference signal, to receive, at the second input terminal of the VCCS, the filtered reference signal from an output of the first noise reduction filter, and to generate an output current of the VCCS based on a difference between the unfiltered reference signal and the filtered reference signal. In other words, the first noise reduction filter may comprise a feedback loop for providing an output voltage from the output of the first noise reduction filter to the second input terminal of the VCCS. The output of the first noise reduction filter may connected to the first terminal of the filter capacitor.

Alternatively, the first noise reduction filter may comprise a filter resistor which replaces the above described VCCS. In this alternative, the first noise reduction filter comprises a filter resistor, a filter capacitor, and a filter switch configured to periodically disconnect an output of the filter resistor from a first terminal of the filter capacitor. A second terminal of the filter capacitor may be connected with the reference potential. In this alternative embodiment, the unfiltered reference signal may be applied to a first terminal of the filter resistor. In other words, in this alternative embodiment, the first noise reduction filter is implemented with a clocked RC circuit which does not comprise a feedback loop.

The error amplifier circuit may comprise a first error amplifier and a second error amplifier, wherein both amplifiers may be configured to compare the filtered reference signal generated by the first noise reduction filter and a signal indicative of the output voltage at the output terminal of the regulator. In other words, the feedback loop may be connected to both the first error amplifier and the second error amplifier.

The error amplifier circuit may further comprise a chopping unit with a first chopping switch and a second chopping switch, wherein the first chopping switch may be configured to periodically (connect and) disconnect, based on a chopping signal, an output of the first error amplifier from an output of the chopping unit, wherein the second chopping switch may be configured to periodically (connect and) disconnect, based on an inverted chopping signal, an output of the second error amplifier from the output of the chopping unit, wherein the inverted chopping signal may be an inverted version of the chopping signal. Again, the chopping switches may be implemented using any sort of know switching elements. The described chopping unit enables modulation of 1/f noise (also known as pink noise, flicker noise or flick noise) in a high frequency.

In particular, no chopping switches may be coupled between the output of the first noise reduction filter and the inputs of the first error amplifier. Moreover, no chopping switches may be coupled between the output of the first noise reduction filter and the inputs of the second error amplifier. A first advantage of using no chopping switches before the amplifier stage is that the frequency of the chopping signal may be substantially increased without limiting the performance of the overall amplifier circuit, i.e. without resulting in even harmonics and a lower DC gain of the overall error amplifier circuit. A second advantage of the absence of chopping switches between the first noise reduction filter and the error amplifiers becomes evident when taking into account the filter capacitor at the output of the first noise reduction filter. Due to continuous switching of a potential chopping switch connected to the filter capacitor, there would be significant leakage of the filter capacitor, resulting in an erroneous input voltage at the input of the error amplifier circuit. Both the significant leakage and the erroneous input is avoided by the presented design of an error amplifier circuit having only chopping switches after the first and the second error amplifiers.

The error amplifier circuit may further comprise a second noise reduction filter configured to generate the control signal for controlling the pass device by reducing (filtering out) chopping noise generated by the first chopping switch and the second chopping switch. Thus, the second noise reduction filter enables suppression or elimination of the modulated 1/f noise modulated by the chopping unit. In particular, the second noise reduction filter may comprise a sample-and-hold circuit configured to reduce said chopping noise by filtering out signal components at odd harmonics of a chopping frequency. The second noise reduction filter may comprise a sample switch, a sample capacitor, a transfer switch, and a hold capacitor. The sample switch may be configured to transfer electrical charge from an input of the sample-and-hold circuit to the sample capacitor. The transfer switch may be configured to transfer electrical charge from the sample capacitor to the hold capacitor which is coupled to an output of the sample-and-hold circuit. The sample-and-hold circuit may be configured to control the sample switch and the transfer switch such that the switches are switched in antiphase.

The sample-and-hold circuit may be configured to control the sample switch based on a sampling signal, wherein a sampling frequency of the sampling signal equals a chopping frequency of the chopping signal.

The linear voltage regulator may further comprise a pre-amplifier configured to pre-amplify the reference voltage of the reference voltage source corresponding to an output voltage at the output terminal of the regulator. Furthermore, the error amplifier circuit together with the pass device may be configured in unity-gain configuration.

According to another aspect, a method for operating a linear voltage regulator is described. The method may comprise steps which correspond to the features of the linear voltage regulator described in the present document. Specifically, the linear voltage regulator may comprise a first noise reduction filter, an error amplifier circuit, and a pass device, wherein the pass device is coupled between an input terminal of the regulator and an output terminal of the regulator. The method may comprise generating, by the error amplifier circuit, a control signal for controlling the pass device based on a filtered reference signal and an output voltage at the output terminal of the regulator. The method may comprise generating, by the first noise reduction filter, the filtered reference signal based on a reference voltage of a reference voltage source by reducing noise originating from the reference voltage source or noise generated by one or more passive components coupled between the reference voltage source and the first noise reduction filter.

The first noise reduction filter may comprise a voltage controlled current source VCCS, a filter capacitor, and a filter switch. The method may comprise periodically disconnecting, using said filter switch, an output of the VCCS from a first terminal of the filter capacitor. Further, the method may comprise receiving, at a first input terminal of the VCCS, an unfiltered reference signal, receiving, at a second input terminal of the VCCS, the filtered reference signal from an output of the first noise reduction filter, and generating an output current of the VCCS based on a difference between the unfiltered reference signal and the filtered reference signal.

The error amplifier circuit may comprise a first error amplifier and a second error amplifier, and the method may comprise comparing, by both error amplifiers in parallel, the filtered reference signal generated by the first noise reduction filter and a signal indicative of the output voltage at the output terminal of the regulator.

The error amplifier circuit may further comprise a chopping unit with a first chopping switch and a second chopping switch. The method may then comprise periodically disconnecting, by the first chopping switch, based on a chopping signal, an output of the first error amplifier from an output of the chopping unit. The method may also comprise periodically disconnecting, by the second chopping switch, based on an inverted chopping signal, an output of the second error amplifier from the output of the chopping unit, wherein the inverted chopping signal is an inverted version of the chopping signal. No chopping switches may be coupled between the output of the first noise reduction filter and the inputs of the first error amplifier. No chopping switches may be coupled between the output of the first noise reduction filter and the inputs of the second error amplifier.

The error amplifier circuit may further comprise a second noise reduction filter. The method may comprise generating, by the second noise reduction filter, the control signal for controlling the pass device by reducing chopping noise generated by the first chopping switch and the second chopping switch. The second noise reduction filter may comprise a sample-and-hold circuit, and the method may comprise reducing, by the sample-and-hold circuit, said chopping noise by filtering out signal components at odd harmonics of a chopping frequency. The second noise reduction filter may comprise a sample switch, a sample capacitor, a transfer switch, and a hold capacitor. The method may comprise transferring, by the sample switch, electrical charge from an input of the sample-and-hold circuit to the sample capacitor, and transferring, by the transfer switch, electrical charge from the sample capacitor to the hold capacitor which is coupled to an output of the sample-and-hold circuit. The method may comprise controlling the sample switch and the transfer switch such that the switches are switched in antiphase. Moreover, the method may comprise controlling the sample switch based on a sampling signal, wherein a sampling frequency of the sampling signal equals a chopping frequency of the chopping signal.

The method may comprise pre-amplifying the reference voltage of the reference voltage source corresponding to an output voltage at the output terminal of the regulator. The method may comprise configuring the error amplifier circuit together with the pass device in unity-gain configuration.

According to a further aspect, a software program is described. The software program may be adapted for execution on a processor and for performing the method steps outlined in the present document when carried out by the processor.

According to another aspect, a storage medium is described. The storage medium may comprise a software program adapted for execution on a processor and for performing the method steps outlined in the present document when carried out by the processor.

According to a further aspect, a computer program product is described. The computer program product may comprise instructions for performing the method steps outlined in the present document when carried out by the processor.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The present invention is illustrated by way of example, and not by way of limitation, in the figures of the accompanying drawings in which like reference numerals refer to similar or identical elements, and in which.

DESCRIPTION

Figure 1:
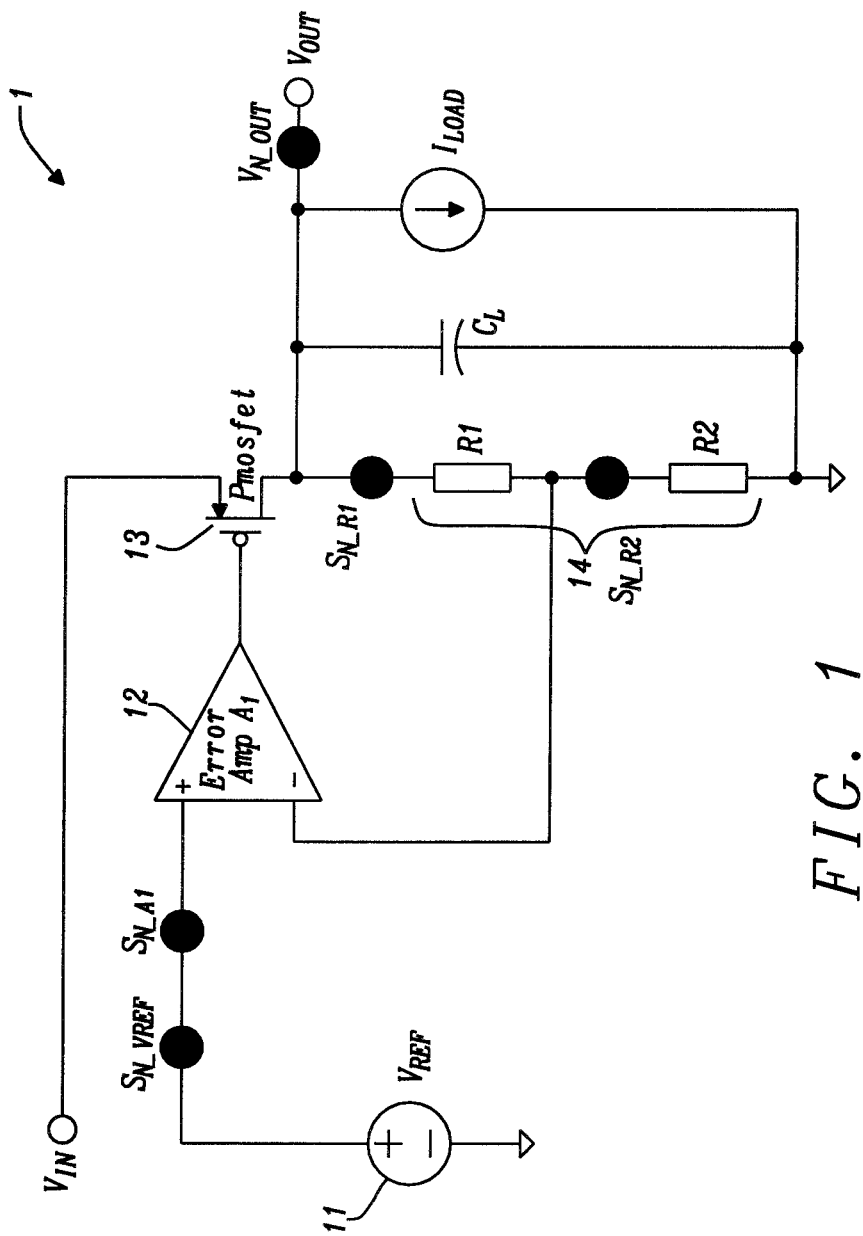
FIG. 1 shows a conventional structure of an LDO regulator.

FIG. 1 shows a conventional structure of an LDO regulator 1. Generally, the conventional LDO regulator 1 consists of four main units: a voltage reference source 11, an error-amplifier 12, pass transistor 13, and high resistance divider 14. The pass transistor 13 at the output is configured in common-source configuration. Due to its high transconductance value and large geometry device, the noise voltage source of the pass transistor 13 can be ignored. According to the noise study of the conventional LDO regulator structure, the total output noise voltage over a bandwidth from $f_1$ to $f_2$ may be determined as follows:

$$V_{N\_OUT} = \sqrt{\int_{f1}^{f2}(S_{N\_OUT})^2 * df}$$

$$V_{N\_OUT} = \sqrt{\int_{f1}^{f2}\left(S_{N\_R1}^2 + \left(\frac{R1}{R2}\right)^2 * S_{N\_R2}^2 + \beta^2 * S_{N\_VREF}^2 + \beta^2 * S_{N\_A1\_WN}^2 + \beta^2 * S_{N\_A1\_FN}^2\right) * df}$$

In the above equations, the following variables are used:
The voltage noise spectral density in V/sqrt (Hz) of each main unit is denoted by $S_{N\_XX}$.

$S_{N\_A1\_WN}$ is the white voltage noise spectral density of the error-amplifier 12 (i.e., its voltage noise spectral density does not vary with frequency).

$S_{N\_A1\_FN}$ is the 1/f voltage noise spectral density of the error-amplifier 12 (i.e., its voltage noise spectral density is inversely proportional to the square root of the frequency).

β is the closed-loop gain and $\beta=V_{OUT}/V_{REF}=1+R1/R2$.

$S_{N\_OUT}$ is the LDO output voltage noise spectral density in V/sqrt (Hz).

Figure 2:
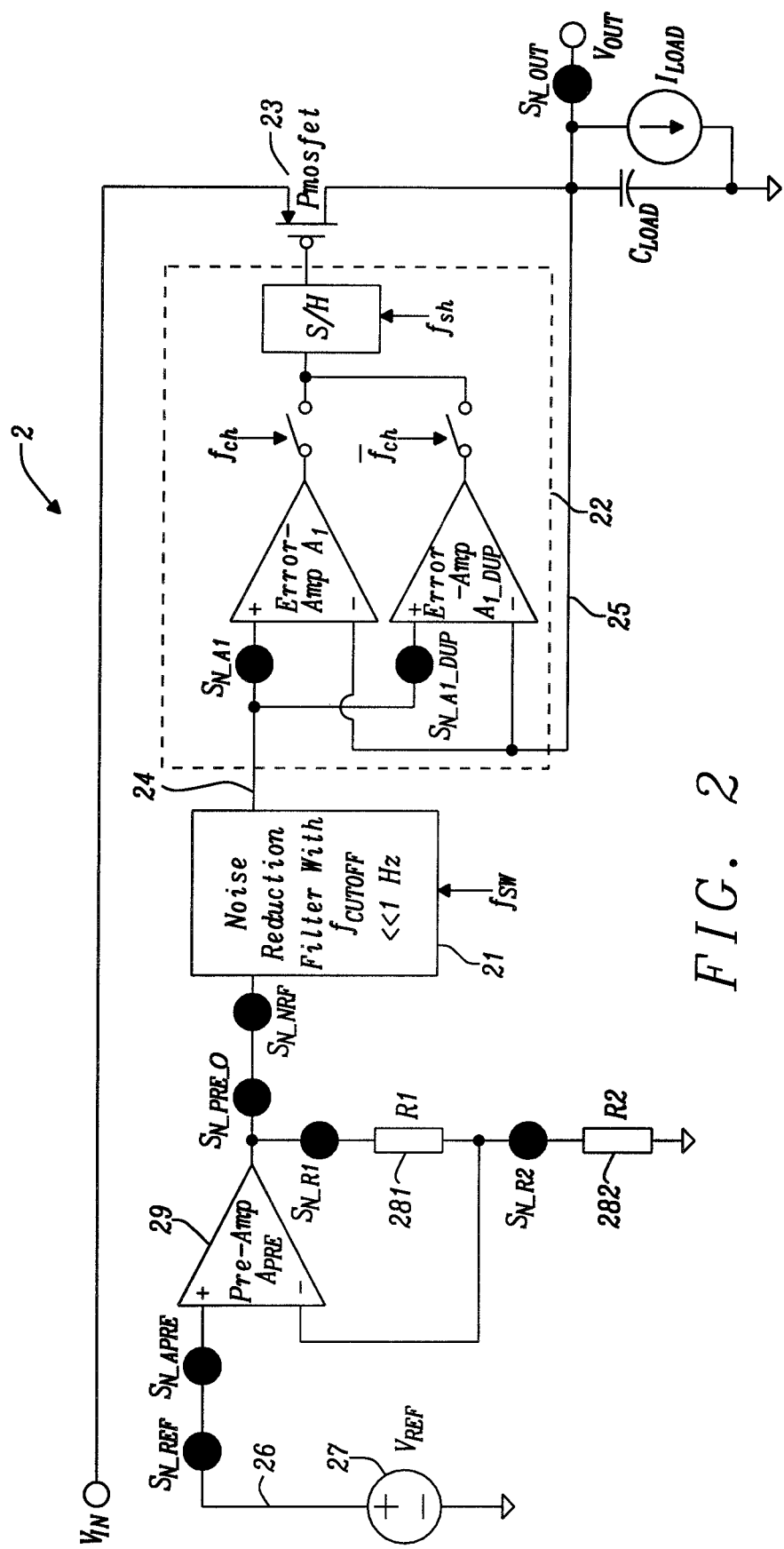
FIG. 2 shows an example for a proposed LDO regulator with circuits for noise reduction.

FIG. 2 shows an example for a proposed LDO regulator 2 with circuits for noise reduction. The LDO regulator 2 comprises a first noise reduction filter 21, an error amplifier circuit 22, and a pass device 23. The pass device 23 is coupled between an input terminal of the regulator 2 and an output terminal of the regulator 2. The error amplifier circuit 22 generates a control signal for controlling the pass device 23 based on a filtered reference signal 24 and an output voltage 25 at the output terminal of the regulator 2. The first noise reduction filter 21 generates the filtered reference signal 24 based on a reference voltage 26 of a reference voltage source 27 by reducing noise originating from the reference voltage source 27 or noise generated by one or more passive components 281, 282 coupled between the reference voltage source 27 and the first noise reduction filter 21. The regulator also comprises an optional pre-amplifying circuit 29.

Figure 3:
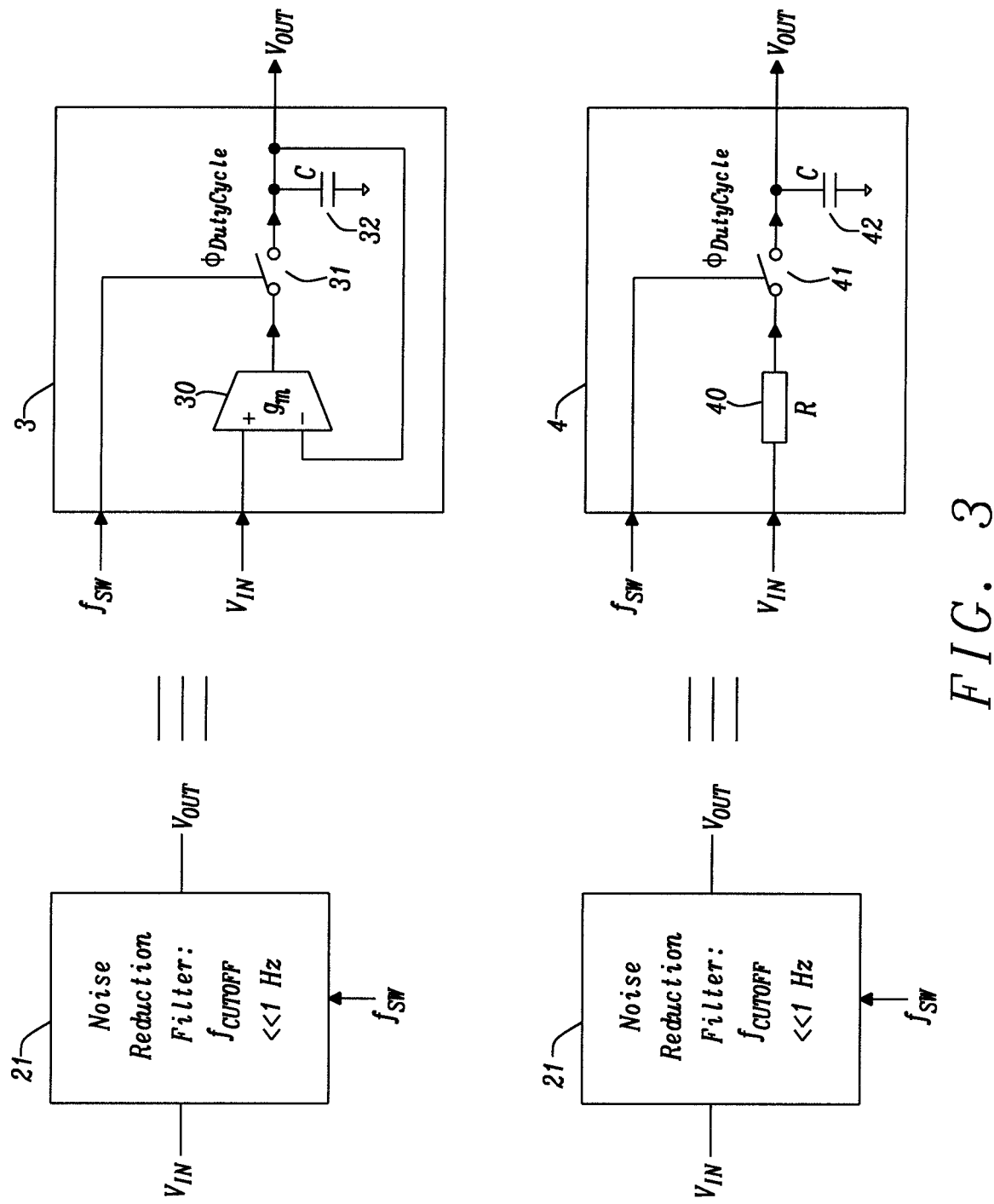
FIG. 3 shows examples for proposed clocked noise reduction filters using a clock with a very small switching duty cycle ($\phi_{DUTYCYCLE}$)

FIG. 3 shows two examples for proposed clocked noise reduction filters 3 and 4 using a clock with a very small switching duty cycle ($\phi_{DUTYCYCLE}$). The proposed clocked noise reduction filters 3 and 4 may be used to implement the first noise reduction filter 21 illustrated in FIG. 2.

As shown in the upper half of FIG. 3, in a first embodiment of a noise reduction filter 3, a transconductor (gm) 30 is placed in a feedback loop arrangement with an on-chip capacitor 32 (C) forming a first order gm-C low pass filter, wherein a cutoff frequency is determined by the ratio gm/C, where C is the integrating capacitance present. However, area limitations restrict the maximum capacitance that can be present on-chip to pico-Farad values.

To realize very low cutoff frequencies for the low pass filter, a switch 31 is added between the transconductor 30 output and the capacitor 32, reducing the effective transconductance ($gm_{EFF}$). The switch 31 is controlled using a clock with a very small duty cycle ($\phi_{DUTYCYCLE}=T_S/(T_S+T_H)$) i.e. very short sample time ($T_S$) and long hold time ($T_H$). At this, the sample time $T_S$ denotes the time interval during which the switch 31 is turned on (i.e. closed) and the hold time $T_H$ denotes the time interval during which the switch 31 is turned off (i.e. open).

With the switch operating at clock of $f_{SW}=1$ kHz with duty cycle $\phi_{DUTYCYCLE}$, the effective transconductance of the switched filter can be given as $Gm_{EFF}=\phi_{DUTYCYCLE}*gm$.

Thus, the effective filter pole location is at $f_{CUTOFF}=f_{-3dB}=(½\pi)*(gm_{EFF}/C)=(½\pi)*(\phi_{DUTYCYCLE}*gm/C)$.

As shown in the lower half of FIG. 3, in a second embodiment of a noise reduction filter 4, the first noise reduction filter comprises a filter resistor 40, a filter capacitor 42, and a filter switch 41 configured to periodically disconnect an output of the filter resistor 40 from a first terminal of the filter capacitor 42. A second terminal of the filter capacitor 42 may be connected with the reference potential. In this second embodiment, the first noise reduction filter is implemented with a clocked RC circuit which does not comprise a feedback loop. Using the described noise reduction filter 4, cutoff frequencies below 1 Hz (such as e.g. 0.1 Hz) may be achieved. The effective filter pole location of this second embodiment is at $f_{CUTOFF}=f_{-3dB}=(½\pi)*[\phi_{DUTYCYCLE}/(R*C)]$.

Figure 4:
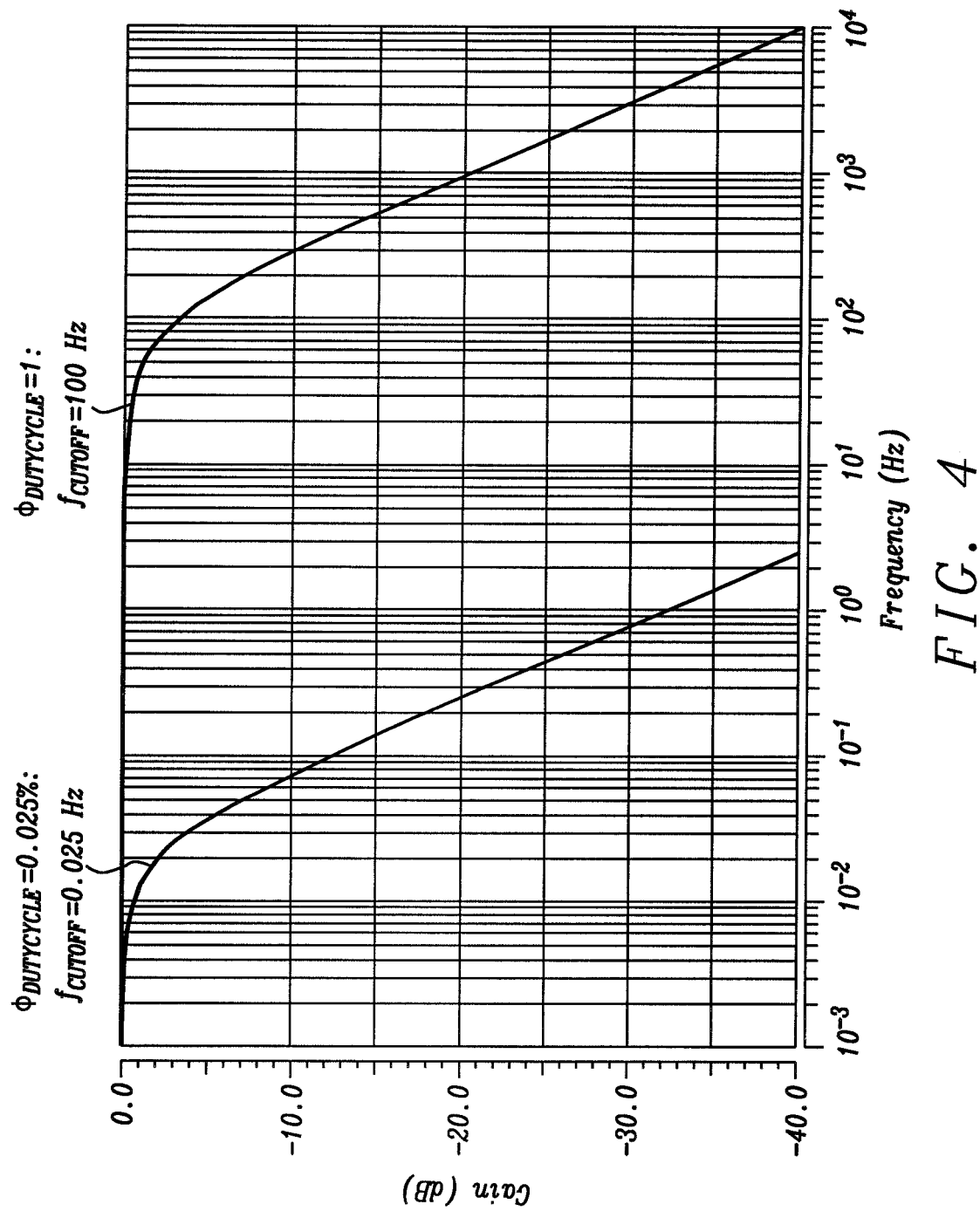
FIG. 4 shows Bode magnitude responses from the clocked noise reduction filter with switching duty cycles $\phi_{DUTYCYCLE}=1$ and $\phi_{DUTYCYCLE}=0.025\%$.

For the first embodiment of a noise reduction filter 3, FIG. 4 shows the Bode magnitude responses from the proposed noise reduction filter 3 using a clock of in kHz with duty cycles of $\phi_{DUTYCYCLE}=1$ and $\phi_{DUTYCYCLE}=0.025\%$ while the ratio gm/C is $2\pi*100$ Hz.

Figure 5:
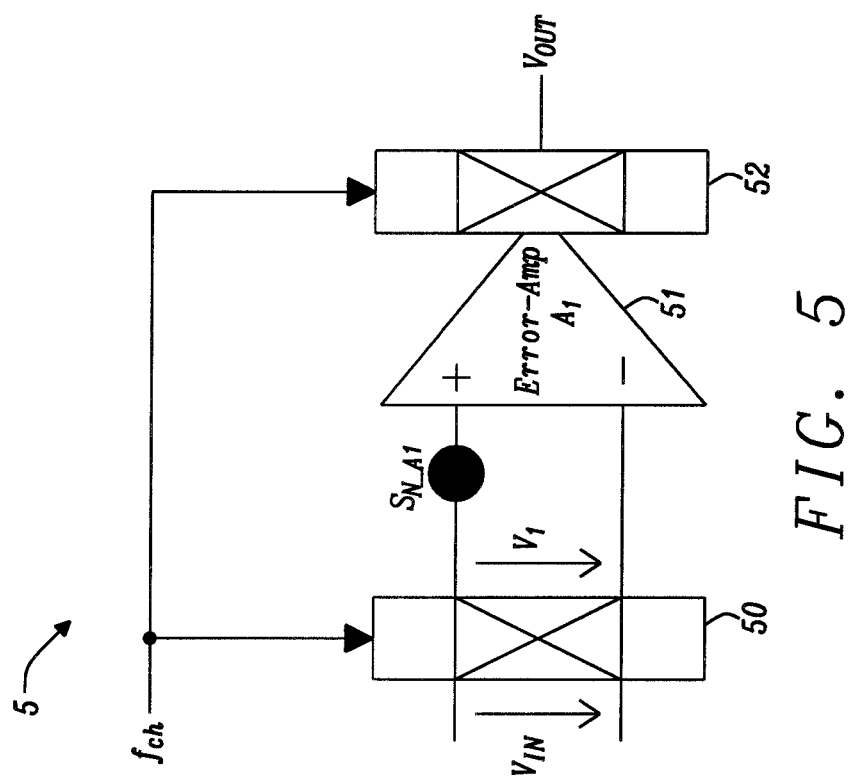
FIG. 5 shows a conventional chopper-type error amplifier.
Figure 7:
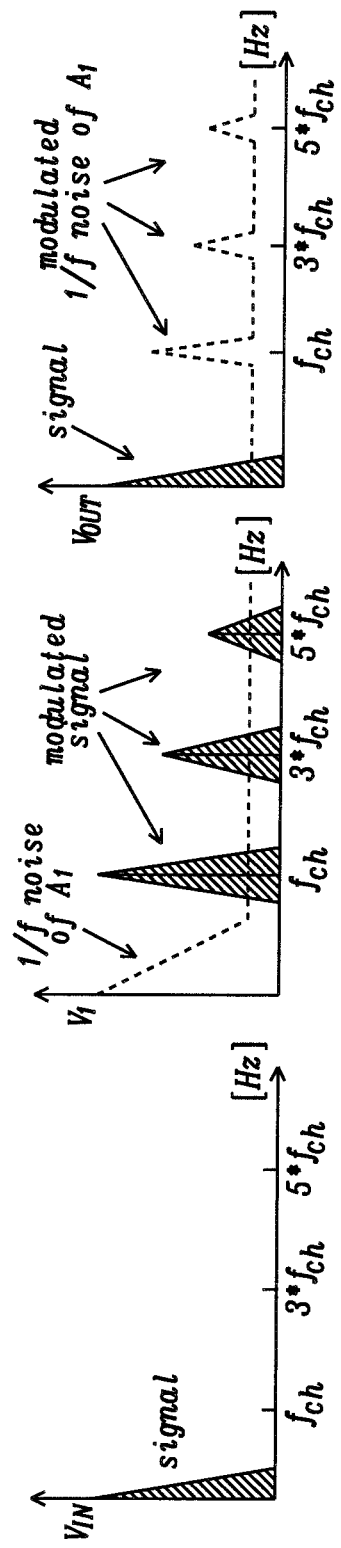
FIG. 7 shows a frequency domain depiction of signals within a conventional chopper-type error amplifier.

FIG. 5 shows a conventional chopper-type error amplifier 5. The input voltage $V_{IN}$ first passes through a chopper 50 driven by a clock at chopping frequency $f_{ch}$. Next, the modulated signal is amplified by error amplifier 51 together with its own 1/f noise. As can be seen in FIG. 7, the second chopper 52 then demodulates the amplified input signal back to direct current DC. At the same time, the second chopper 52 modulates the 1/f noise to the odd harmonics of $f_{ch}$.

There are two major limitations of this conventional approach due to which it cannot be used for the proposed LDO under consideration. On the one hand, the input $V_{IN}$ is derived from the low duty cycle switched gm-C filter's on-chip storage capacitor C whose value is limited to pico-Farad. If the 1$^{st}$ stage chopper 50 is placed before the error amplifier 51, then due to continuous switching there will be a significant leakage in the stored charge at C resulting in an erroneous input voltage being fed to the error amplifier 51.

On the other hand, the chopping frequency is limited by the bandwidth of the error amplifier. If the 1$^{st}$ stage chopper 50 is placed before the error amplifier 51, this requires the error amplifier bandwidth to be at least twice the chopping frequency for maximum gain of this stage. If a high chopping frequency in MHz is used, the limited bandwidth of the error amplifier 51 results in even harmonics and lower DC gain for the amplifier and chopper stage. As a result, the effective DC gain of this stage drops down to a low value resulting in inaccurate LDO output.

Figure 6:
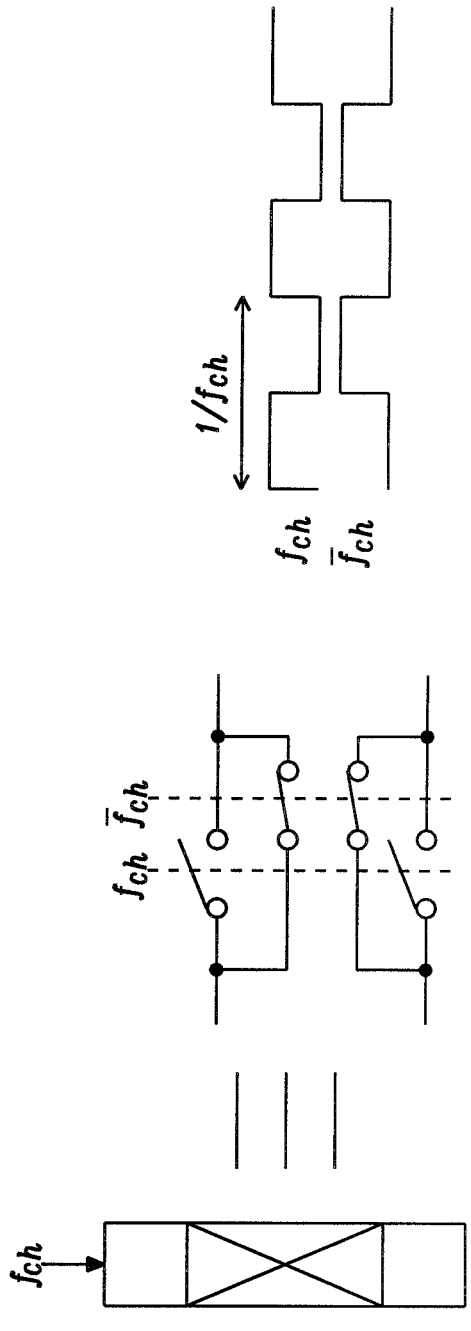
FIG. 6 shows an implementation of a chopper and chopping clock.

FIG. 6 shows an implementation of a chopper and chopping clock. The chopper illustrated in FIG. 6 may be used to implement the first chopper 50 or the second chopper 52 in FIG. 5. FIG. 7 shows a frequency domain depiction of signals within a conventional chopper-type error amplifier. The left diagram shows the input voltage $V_{IN}$ (denoted as "signal") over frequency, the middle diagram shows the input voltage $V_1$ of the error amplifier 51 (i.e. the output voltage of the first chopper 50) over frequency, and the right diagram shows the output voltage $V_{OUT}$ of the conventional chopper-type error amplifier 5.

Figure 8:
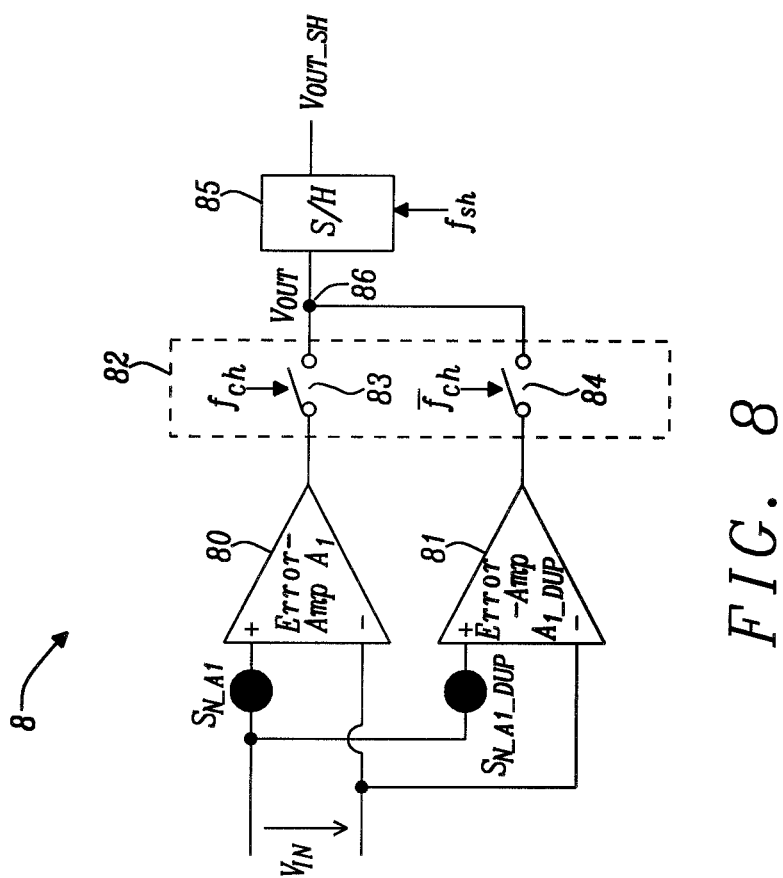
FIG. 8 shows an example for a proposed chopper-type error amplifier.

FIG. 8 shows an example for a proposed chopper-type error amplifier circuit 8. The error amplifier circuit 8 comprises a first error amplifier 80 and a second error amplifier 81, wherein both amplifiers are configured to compare a filtered reference signal generated by the first noise reduction filter and a signal indicative of the output voltage at the output terminal of the regulator. In other words, the feedback loop may be connected to both the first error amplifier and the second error amplifier. The error amplifier circuit comprises a chopping unit 82 with a first chopping switch 83 and a second chopping switch 84, wherein the first chopping switch 83 periodically connects and disconnects, based on a chopping signal, an output of the first error amplifier 80 from an output 86 of the chopping unit 82, wherein the second chopping switch 84 periodically connects and disconnects, based on an inverted chopping signal, an output of the second error amplifier 81 from the output 86 of the chopping unit. The inverted chopping signal may be an inverted version of the chopping signal. The error amplifier circuit 8 further comprises a second noise reduction filter 85 for generating the control signal for controlling the pass device.

Figure 10:
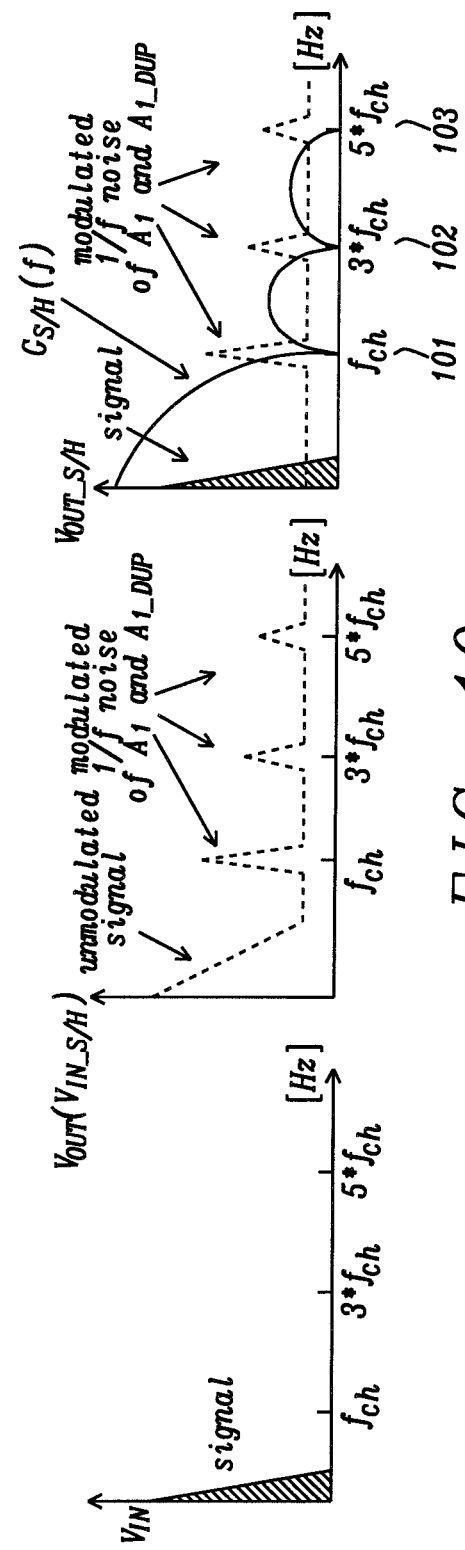
FIG. 10 shows examples for frequency domain depiction of signals within the proposed chopper-type error amplifier.

In other words, in FIG. 8, the error amplifier is placed twice without the first chopper and outputs of both error amplifiers are connected through the second chopper 82 in anti-phase driven by the chopping frequency $f_{ch}$. As can be seen in FIG. 10, the input voltage $V_{IN}$ is not modulated and passes through the dual placed error amplifiers to the output in anti-phase through the second chopper 82. At the same time, the second chopper 82 modulates the 1/f noise of each error amplifier to the odd harmonics of $f_{ch}$ in anti-phase. The output of the second chopper 82 then passes through the second noise reduction filter 85 (e.g. a sampling-and-hold circuit) driven by the same clock at chopping frequency $f_{ch}$, which acts a notch filter at the odd harmonics of $f_{ch}$ and suppresses the modulated 1/f noises.

This new chopper-type error amplifier overcomes the limitations mentioned above. Firstly, charge leakage from the switched gm-C filter's storage capacitor C due to chopping is eliminated. Since the chopping is done at the output, no charge leakage at the gate terminal is possible. And secondly, since chopping only takes place at the output of the error amplifiers 80 and 81, the bandwidth of the amplifier is not limiting the performance of the overall amplifier circuit 8. Thus, this solution provides the freedom to increase the chopping frequency up to the MHz-range as long as the circuit is fully functional.

Figure 9:
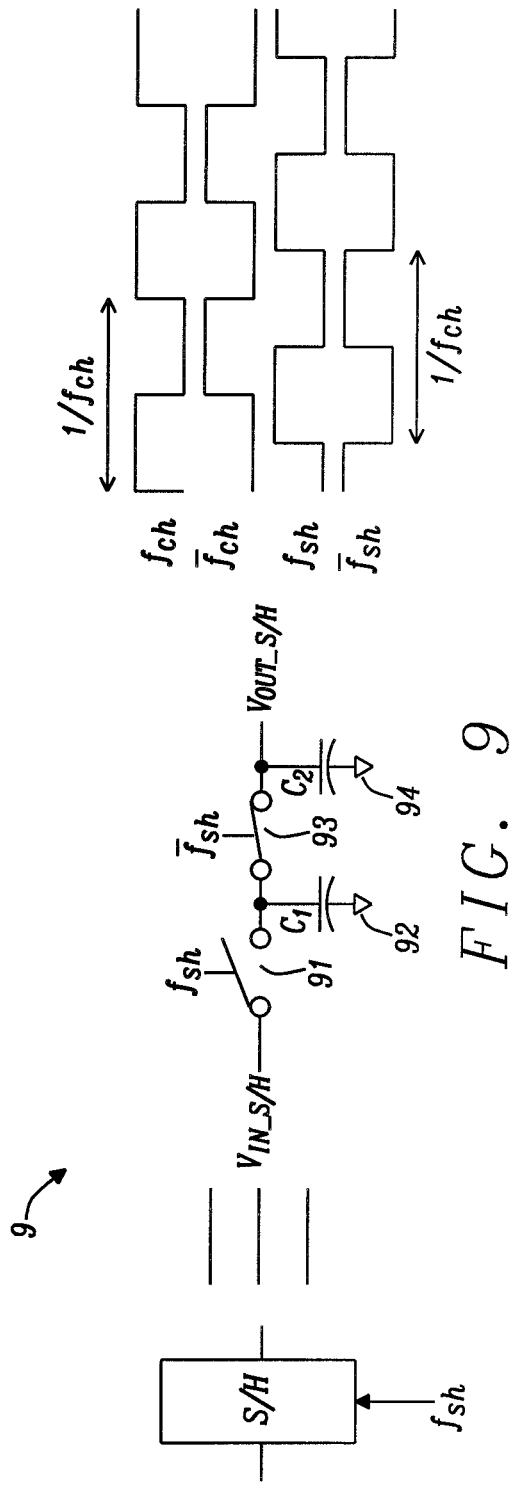
FIG. 9 shows examples for implementations of S/H (sampling-and-hold) circuit, chopping and S/H clocks.

FIG. 9 shows a sample-and-hold circuit 9 which may be used to implement the second noise reduction filter 85 in FIG. 8. The sample-and-hold circuit 9 comprises a sample switch 91, a sample capacitor 92, a transfer switch 93, and a hold capacitor 94. The sample switch 91 transfers electrical charge from an input of the sample-and-hold circuit 9 to the sample capacitor 92. The transfer switch 93 then transfers electrical charge from the sample capacitor 92 to the hold capacitor 94 which is coupled to an output of the sample-and-hold circuit 9. As can be seen from the waveforms on the right side of FIG. 9, the switches 91 and 93 are switched in antiphase. The sample-and-hold circuit 9 controls the sample switch based on a sampling signal, wherein a sampling frequency of the sampling signal equals a chopping frequency of the chopping signal. As a result, the notchpoints 101, 102, and 103 in the right diagram of FIG. 10 match the peaks of the modulated 1/f noise, and the 1/f noise may be substantially filtered out/reduced.

Figure 11:
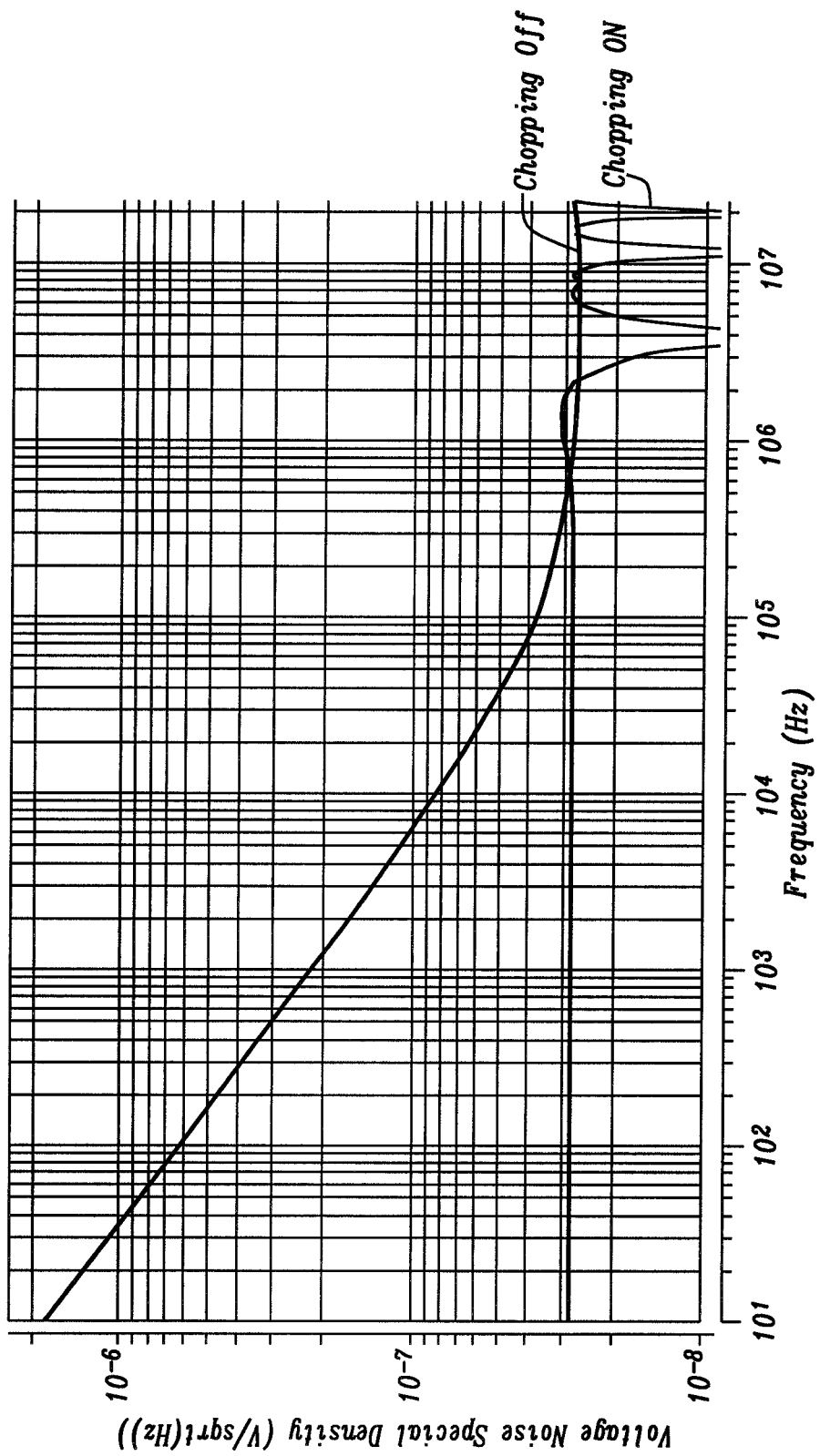
FIG. 11 shows voltage noise spectral densities of the proposed chopper-type error amplifier.

Finally, FIG. 10 shows examples for frequency domain depiction of signals within the proposed chopper-type error amplifier. The left diagram shows the input voltage $V_{IN}$ (denoted as "signal") over frequency, the middle diagram shows the output voltage $V_{OUT}$ at the output 86 of the chopping unit 82 over frequency, and the right diagram shows the output voltage $V_{OUT\_SH}$ of the proposed chopper-type error amplifier 8. FIG. 11 shows voltage noise spectral densities of the proposed chopper-type error amplifier. To be more specific, FIG. 7 shows the voltage noise spectral density for the proposed chopper-type error amplifier 8 using frequencies of $f_{ch}=f_{sh}=4$ MHz.

Turning now back to the big picture of the proposed LDO regulator with filters for noise reduction in FIG. 2, the total output noise voltage over a bandwidth from $f_1$ to $f_2$ may be written as follows:

$$V_{N\_OUT} = \sqrt{\int_{f_1}^{f_2} [(S_{N\_PRE\_O}^2 + S_{N\_NRF}^2) * G_{NRF}^2 + S_{N\_A1\_WN}^2] * df} \sim$$

$$\sqrt{\int_{f_1}^{f_2} (0 + S_{N\_A1\_WN}^2) * df}$$

$$V_{N\_OUT} = \sqrt{\int_{f_1}^{f_2} S_{N\_A1\_WN}^2 * df}$$

In other words, the proposed LDO's output noise voltage is reduced to the white noise voltage of the error amplifier. This is achieved e.g. by removing the pre-amplified output noise by the first noise reduction filter 21 having a low cutoff frequency of e.g. $f_{CUTOFF} \ll 1$ Hz, including the noise of the first noise reduction filter 21. The 1/f noise of the error amplifiers 80 and 81 is modulated and cancelled by the proposed new chopper-type error amplifier with high chopping frequency.

In conclusion, the present document describes an LDO regulator with a pre-amplifier, a clocked noise reduction filter, a chopper-type error amplifier and a pass transistor, wherein an LDO reference voltage is pre-amplified corresponding to the LDO output voltage and the error amplifier together with pass transistor is configured in unity-gain configuration. Moreover, a clocked noise reduction filter is presented with a low duty cycle switched transcondutor (gm) in a feedback loop arrangement with on-chip capacitor (C), forming a continuous gm-C low pass filter having very low cutoff frequency. Further, a chopper-type error amplifier uses duplicated error amplifiers to modulate 1/f noise in high frequency and a sample-and-hold stage to suppress the modulated 1/f noise.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A linear voltage regulator comprising a first noise reduction filter, an error amplifier circuit, and a pass device, wherein
the pass device is coupled between an input terminal of the regulator and an output terminal of the regulator;
the error amplifier circuit is configured to generate a control signal for controlling the pass device based on a filtered reference signal and an output voltage at the output terminal of the regulator; and
the first noise reduction filter is configured to generate the filtered reference signal based on a reference voltage of a reference voltage source by reducing noise originating from the reference voltage source or noise generated by one or more passive components coupled between the reference voltage source and the first noise reduction filter.

2. The linear voltage regulator according to claim 1, wherein the first noise reduction filter comprises a voltage controlled current source VCCS, a filter capacitor, and a filter switch configured to periodically disconnect an output of the VCCS from a first terminal of the filter capacitor.

3. The linear voltage regulator according to claim 1, wherein the VCCS is configured
to receive, at a first input terminal of the VCCS, an unfiltered reference signal,
to receive, at a second input terminal of the VCCS, the filtered reference signal from an output of the first noise reduction filter, and
to generate an output current of the VCCS based on a difference between the unfiltered reference signal and the filtered reference signal.

4. The linear voltage regulator according to claim 1, wherein the error amplifier circuit comprises a first error amplifier and a second error amplifier, wherein both amplifiers are configured to compare the filtered reference signal generated by the first noise reduction filter and a signal indicative of the output voltage at the output terminal of the regulator.

5. The linear voltage regulator according to claim 4, wherein the error amplifier circuit further comprises a chopping unit with a first chopping switch and a second chopping switch, wherein the first chopping switch is configured to periodically disconnect, based on a chopping signal, an output of the first error amplifier from an output of the chopping unit, wherein the second chopping switch is configured to periodically disconnect, based on an inverted chopping signal, an output of the second error amplifier from the output of the chopping unit, wherein the inverted chopping signal is an inverted version of the chopping signal.

6. The linear voltage regulator according to claim 4, wherein no chopping switches are coupled between the output of the first noise reduction filter and the inputs of the first error amplifier, and wherein no chopping switches are coupled between the output of the first noise reduction filter and the inputs of the second error amplifier.

7. The linear voltage regulator according to claim 4, wherein the error amplifier circuit further comprises a second noise reduction filter configured to generate the control signal for controlling the pass device by reducing chopping noise generated by the first chopping switch and the second chopping switch.

8. The linear voltage regulator according to claim 7, wherein the second noise reduction filter comprises a sample-and-hold circuit configured to reduce said chopping noise by filtering out signal components at odd harmonics of a chopping frequency.

9. The linear voltage regulator according to claim 7, wherein the second noise reduction filter comprises a sample switch, a sample capacitor, a transfer switch, and a hold capacitor, wherein
the sample switch is configured to transfer electrical charge from an input of the sample-and-hold circuit to the sample capacitor, and
the transfer switch is configured to transfer electrical charge from the sample capacitor to the hold capacitor which is coupled to an output of the sample-and-hold circuit.

10. The linear voltage regulator according to claim 9, wherein the sample-and-hold circuit is configured to control the sample switch and the transfer switch such that the switches are switched in antiphase.

11. The linear voltage regulator according to claim 9, wherein the sample-and-hold circuit is configured to control the sample switch based on a sampling signal, wherein a sampling frequency of the sampling signal equals a chopping frequency of the chopping signal.

12. The linear voltage regulator according to claim 1, further comprising a pre-amplifier configured to pre-amplify the reference voltage of the reference voltage source corresponding to an output voltage at the output terminal of the regulator.

13. The linear voltage regulator according to claim 1, wherein the error amplifier circuit together with the pass device are configured in unity-gain configuration.

14. A method of operating a linear voltage regulator comprising a first noise reduction filter, an error amplifier circuit, and a pass device, wherein the pass device is coupled between an input terminal of the regulator and an output terminal of the regulator, wherein the method comprises
generating, by the error amplifier circuit, a control signal for controlling the pass device based on a filtered reference signal and an output voltage at the output terminal of the regulator; and
generating, by the first noise reduction filter, the filtered reference signal based on a reference voltage of a reference voltage source by reducing noise originating from the reference voltage source or noise generated by one or more passive components coupled between the reference voltage source and the first noise reduction filter.

15. The method of claim 14, wherein the first noise reduction filter comprises a voltage controlled current source VCCS, a filter capacitor, and a filter switch, the method comprising:
periodically disconnecting, using said filter switch, an output of the VCCS from a first terminal of the filter capacitor.

16. The method of claim 14, further comprising
receiving, at a first input terminal of the VCCS, an unfiltered reference signal,
receiving, at a second input terminal of the VCCS, the filtered reference signal from an output of the first noise reduction filter, and
generating an output current of the VCCS based on a difference between the unfiltered reference signal and the filtered reference signal.

17. The method of claim 14, wherein the error amplifier circuit comprises a first error amplifier and a second error amplifier, wherein the method further comprises
comparing, by both error amplifiers, the filtered reference signal generated by the first noise reduction filter and a signal indicative of the output voltage at the output terminal of the regulator.

18. The method of claim 17, wherein the error amplifier circuit further comprises a chopping unit with a first chopping switch and a second chopping switch, wherein the method comprises
- periodically disconnecting, by the first chopping switch, based on a chopping signal, an output of the first error amplifier from an output of the chopping unit, and
- periodically disconnecting, by the second chopping switch, based on an inverted chopping signal, an output of the second error amplifier from the output of the chopping unit, wherein the inverted chopping signal is an inverted version of the chopping signal.

19. The method of claim 17, wherein no chopping switches are coupled between the output of the first noise reduction filter and the inputs of the first error amplifier, and wherein no chopping switches are coupled between the output of the first noise reduction filter and the inputs of the second error amplifier.

20. The method of claim 17, wherein the error amplifier circuit further comprises a second noise reduction filter, the method comprising
- generating, by the second noise reduction filter, the control signal for controlling the pass device by reducing chopping noise generated by the first chopping switch and the second chopping switch.

21. The method of claim 20, wherein the second noise reduction filter comprises a sample-and-hold circuit, the method comprising
- reducing, by the sample-and-hold circuit, said chopping noise by filtering out signal components at odd harmonics of a chopping frequency.

22. The method of claim 20, wherein the second noise reduction filter comprises a sample switch, a sample capacitor, a transfer switch, and a hold capacitor, the method comprising
- transferring, by the sample switch, electrical charge from an input of the sample-and-hold circuit to the sample capacitor, and
- transferring, by the transfer switch, electrical charge from the sample capacitor to the hold capacitor which is coupled to an output of the sample-and-hold circuit.

23. The method of claim 22 comprising
controlling the sample switch and the transfer switch such that the switches are switched in antiphase.

24. The method of claim 22 comprising
controlling the sample switch based on a sampling signal, wherein a sampling frequency of the sampling signal equals a chopping frequency of the chopping signal.

25. The method of claim 14, further comprising
pre-amplifying the reference voltage of the reference voltage source corresponding to an output voltage at the output terminal of the regulator.

26. The method of claim 14, further comprising
configuring the error amplifier circuit together with the pass device in unity-gain configuration.

* * * * *